US012805344B2

(12) United States Patent
Paital et al.

(10) Patent No.: US 12,805,344 B2
(45) Date of Patent: Nov. 17, 2026

(54) METHODS AND APPARATUS TO EMBED HOST DIES IN A SUBSTRATE

(71) Applicant: Intel Corporation, Santa Clara, CA (US)

(72) Inventors: Sameer Paital, Chandler, AZ (US); Gang Duan, Chandler, AZ (US); Srinivas Pietambaram, Chandler, AZ (US); Yosuke Kanaoka, Chandler, AZ (US); Tchefor Ndukum, Chandler, AZ (US)

(73) Assignee: Intel Foundry IP LLC, Santa Clara, CA (US)

( * ) Notice: Subject to any disclaimer, the term of this patent is extended or adjusted under 35 U.S.C. 154(b) by 637 days.

(21) Appl. No.: 17/480,953

(22) Filed: Sep. 21, 2021

(65) Prior Publication Data

US 2023/0092903 A1 Mar. 23, 2023

(51) Int. Cl.
*H10W 70/60* (2026.01)
*H10W 70/05* (2026.01)
(Continued)

(52) U.S. Cl.
CPC ........ *H10W 70/611* (2026.01); *H10W 70/093* (2026.01); *H10W 70/65* (2026.01);
(Continued)

(58) Field of Classification Search
CPC ............. H01L 23/5385; H01L 21/4853; H01L 23/5381; H01L 24/05; H01L 24/06; H01L 24/08; H01L 24/13; H01L 24/14; H01L 24/16; H01L 24/80; H01L 24/81; H01L 23/481; H01L 24/09; H01L 24/17; H01L 2224/05147; H01L 2224/05611;
(Continued)

(56) References Cited

U.S. PATENT DOCUMENTS 6,659,512 B1 12/2003 Harper et al.
8,237,274 B1 * 8/2012 Rahman ............ H01L 23/49811 257/737

(Continued)

FOREIGN PATENT DOCUMENTS

CN 101271873 A * 9/2008 ............. H01L 22/34

OTHER PUBLICATIONS

Wu, D. et al., Research of Wafer Level Bonding Process Based on Cu—Sn Eutectic. Micromachines, 11(9), 789. https://doi.org/10.3390/mi11090789 (Year: 2020).*

(Continued)

*Primary Examiner* — Sue A Purvis
*Assistant Examiner* — Carnell Hunter, III
(74) *Attorney, Agent, or Firm* — Hanley, Flight & Zimmerman, LLC

(57) ABSTRACT

Methods and apparatus to embed host dies in a substrate are disclosed. An apparatus includes a first die having a first side and a second side opposite the first side. The first side includes a first contact to be electrically coupled with a second die. The second side includes a second contact. The apparatus further includes a substrate including a metal layer and a dielectric material on the metal layer. The first die is encapsulated within the dielectric material. The second contact of the first die is bonded to the metal layer independent of an adhesive.

22 Claims, 11 Drawing Sheets

(51) Int. Cl.

| | |
|---|---|
| ***H10W 70/65*** | (2026.01) |
| ***H10W 90/00*** | (2026.01) |
| *H10W 20/20* | (2026.01) |
| *H10W 72/00* | (2026.01) |
| *H10W 72/20* | (2026.01) |
| *H10W 72/90* | (2026.01) |
| *H10W 80/00* | (2026.01) |

(52) U.S. Cl.

CPC ....... *H10W 72/248* (2026.01); *H10W 90/401* (2026.01); *H10W 20/20* (2026.01); *H10W 72/016* (2026.01); *H10W 72/07207* (2026.01); *H10W 72/07223* (2026.01); *H10W 72/07236* (2026.01); *H10W 72/07254* (2026.01); *H10W 72/07255* (2026.01); *H10W 72/244* (2026.01); *H10W 72/247* (2026.01); *H10W 72/252* (2026.01); *H10W 72/2524* (2026.01); *H10W 72/2528* (2026.01); *H10W 72/255* (2026.01); *H10W 72/923* (2026.01); *H10W 72/944* (2026.01); *H10W 72/952* (2026.01); *H10W 72/9524* (2026.01); *H10W 72/9528* (2026.01); *H10W 80/102* (2026.01); *H10W 80/163* (2026.01); *H10W 80/211* (2026.01); *H10W 80/312* (2026.01); *H10W 80/314* (2026.01); *H10W 80/743* (2026.01); *H10W 80/754* (2026.01); *H10W 90/724* (2026.01); *H10W 90/794* (2026.01)

(58) Field of Classification Search

CPC . H01L 2224/05647; H01L 2224/06181; H01L 2224/08225; H01L 2224/08502; H01L 2224/08503; H01L 2224/091; H01L 2224/13147; H01L 2224/13611; H01L 2224/14181; H01L 2224/16227; H01L 2224/16502; H01L 2224/16503; H01L 2224/17106; H01L 2224/80006; H01L 2224/8009; H01L 2224/80132; H01L 2224/80805; H01L 2224/8081; H01L 2224/80825; H01L 2224/8083; H01L 2224/80895; H01L 2224/81005; H01L 2224/8109; H01L 2224/81132; H01L 2224/81805; H01L 2224/8181; H01L 2224/81825; H01L 2224/8183; H01L 2224/81895; H01L 2924/20105; H01L 2924/20106; H01L 2224/0557; H01L 23/49816; H01L 23/49827; H01L 24/83; H01L 2224/06131; H01L 2224/16225; H01L 2224/80203; H01L 2224/8385; H01L 2924/15192; H01L 2924/15311

See application file for complete search history.

(56) References Cited

U.S. PATENT DOCUMENTS

| | | | | |
|---|---|---|---|---|
| 8,736,065 | B2 | 5/2014 | Gonzalez et al. | |
| 9,147,638 | B2 * | 9/2015 | Liu | H01L 21/50 |
| 9,842,813 | B2 | 12/2017 | Jiang et al. | |
| 9,881,850 | B2 | 1/2018 | Yu et al. | |
| 10,535,608 | B1 * | 1/2020 | Rubin | H01L 24/73 |
| 10,665,579 | B2 | 5/2020 | Trimberger et al. | |
| 10,833,052 | B2 * | 11/2020 | Shih | H01L 23/5383 |
| 2004/0076408 | A1 * | 4/2004 | Kenny | H01L 23/345 392/340 |
| 2020/0273839 | A1 * | 8/2020 | Elsherbini | H01L 24/13 |
| 2021/0057367 | A1 * | 2/2021 | Signorini | H10P 72/74 |

OTHER PUBLICATIONS

CN-101271873-A translation (Year: 2008).*

Radu et al., "Recent developments of Cu—Cu non-thermo compression bonding for wafer-to-wafer 3D stacking," 2010 IEEE International 3D Systems Integration Conference (3DIC), Nov. 16-18, 2010, 6 pages.

Zhang et al., "Materials, processing and reliability of low temperature bonding in 3D chip stacking," Journal of Alloys and Compounds 750 (2018) 980e995, Apr. 7, 2018, 16 pages.

* cited by examiner

METHODS AND APPARATUS TO EMBED HOST DIES IN A SUBSTRATE

FIELD OF THE DISCLOSURE

This disclosure relates generally to integrated circuit packages and, more particularly, to methods and apparatus to embed host dies in a substrate.

BACKGROUND

There is a constant drive to manufacture integrated circuit (IC) packages with smaller form factors, higher performance, lower power consumption, and/or higher density integrity. Efforts to meet increasing demands for these objectives have included incorporating multiple semiconductor dies into a single package. In some such packages, the separate dies are interconnected through traces, vias, and/or other electrical interconnects within a substrate to which the separate dies are attached. Further, in some instances, to increase the density of signal paths between the separate dies, the electrical interconnects for such signal paths are implemented within a block of semiconductor material, referred to as a host die, that is embedded in the substrate. Typically, host dies are manufactured in a separate fabrication process prior to being embedded in a surrounding substrate and independent of the fabrication processes involved in manufacturing each of the separate semiconductor dies interconnected by the host dies and/or the associated substrate. Host dies within a substrate act as a host to fan out very fine line spacing metal interconnect structures to enable the inclusion of multiple dies according to 2D and 3D integration techniques.

Figure 1:
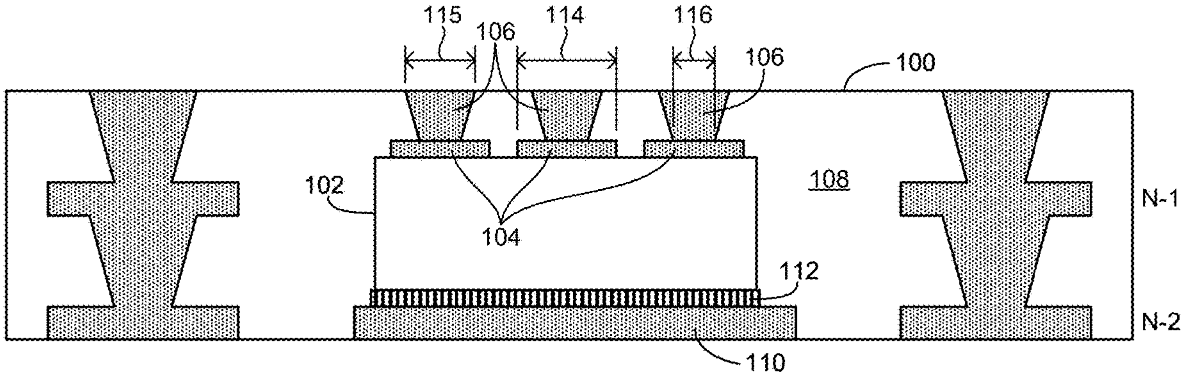
FIG. 1 (Prior Art)
FIG. 1 illustrates a package substrate with a host die embedded therein in accordance with known fabrication techniques.

The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. In general, the same reference numbers will be used throughout the drawing(s) and accompanying written description to refer to the same or like parts. As used herein, unless otherwise stated, the term “above” describes the relationship of two parts relative to Earth. A first part is above a second part, if the second part has at least one part between Earth and the first part. Likewise, as used herein, a first part is “below” a second part when the first part is closer to the Earth than the second part. As noted above, a first part can be above or below a second part with one or more of: other parts therebetween, without other parts therebetween, with the first and second parts touching, or without the first and second parts being in direct contact with one another. Notwithstanding the foregoing, in the case of a semiconductor device, “above” is not with reference to Earth, but instead is with reference to a bulk region of a base semiconductor substrate (e.g., a semiconductor wafer) on which components of an integrated circuit are formed. Specifically, as used herein, a first component of an integrated circuit is “above” a second component when the first component is farther away from the bulk region of the semiconductor substrate than the second component. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in “contact” with another part is defined to mean that there is no intermediate part between the two parts.

DETAILED DESCRIPTION

Two dimensional (2D) and three dimensional (3D) integrated circuits (IC) are being actively explored to advance semiconductor packaging technology because of their advantages associated with small form factor, high performance, low power consumption and high density integration. Many of these advantages are achieved, at least in part, through the use of host dies embedded within a substrate that supports other semiconductor dies (e.g., chiplets (also referred to as tiles)) included within a package. As used herein, a host die is a semiconductor die independently fabricated on a semiconductor wafer (e.g., a silicon wafer) and subsequently embedded within a substrate of an IC package in a manner so that the host die enables a separate semiconductor die attached to the substrate of the IC package and to be electrically coupled with at least one of a different semiconductor die in the package or an electrical component external to the package. Typically, the assembly process for such packages includes the bonding of a host die to the substrate to enable the fan out of very fine line spacing structures with bump pitch (BP) scaling from 55 μm down to 30 μm or less. After being bonded to the substrate, the host die is often encased within an organic dielectric through which holes are then drilled to expose metal pads on the host die. Such holes are filled with metal to provide metal vias that enable the electrical interconnection of the metal pads on the host die with other components (e.g., bumps on mating dies or chiplets) through the metal vias as illustrated in FIG. 1.

FIG. 1 illustrates a package substrate 100 with a host die 102 embedded therein in accordance with known fabrication techniques. As shown in FIG. 1, the host die 102 includes an array of metal (e.g., copper) pads 104 that are aligned with metal (e.g., copper) vias 106 that extend through dielectric material 108 of the substrate 100. Typically, the substrate 100 of FIG. 1 is initially fabricated without the host die 102 such that the area of the host die 102 is initially filled with the dielectric material 108. Thereafter, a cavity is created in the dielectric material 108 that extends down to a die pad 110 included in a metal (e.g., copper) layer within the substrate 100. As represented in FIG. 1, the host die 102 (having been separately fabricated) is placed within the cavity and attached to the die pad 110 with a die adhesive film 112. Frequently, the placement of the host die 102 relative to the substrate 100 is accomplished by a pick and place tool (e.g., a die mount) in which the relative positioning of the two components is accomplished based on alignment of N−1 fiducials at the quarter-panel or full panel level. As used herein, a panel refers to a large substrate onto which an array of semiconductor dies may be attached to create an array of IC packages after the panel is cut (diced) into individual units corresponding to each individual IC package. In some instance, each unit (corresponding to one IC package) on the panel can include one or more separate semiconductor dies. Thus, in such instances, multiple host dies are positioned on a single panel in connection with multiple different packages. The alignment of such host dies using the N−1 fiducials corrects for panel rotation and shift, but does not account for panel warpage (e.g., shrinking) in the X and Y directions (e.g., in the plane of the panel). A similar process of transfer host dies to corresponding IC package substrates can be performed at the wafer level as well.

Following the placement of the host die 102 in the cavity of the substrate 100, the cavity is refilled with dielectric material 108 and/or additionally layers of the dielectric material 108 are added over top of the host die 102. Heat associated with the curing of the die adhesive film 112 and/or the curing of the dielectric material 108 after placement of the host die 102 can cause shrinkage in the die adhesive film 112, which can result in the die shifting relative to its initial placement on the substrate.

Once the host die 102 is embedded within the dielectric material 108, holes are laser drilled through the dielectric material 108 down to the pads 104 on the host die 102. These holes serve as the basis for the metal vias 106, which are created by filling the holes with metal, thereby completing the fabrication of the substrate 100. However, in many circumstances, the vias 106 may not be perfectly aligned with the pads 104. Rather, misalignment of the vias 106 is relatively common due to the warpage of the panel that is not accounted for when aligning the placement of the host die 102 and the subsequent shifting of the host die 102 due to shrinkage of the die adhesive film 112, as discussed above. What is more, the shifting of the host die 102 relative to the substrate 100 from an expected (e.g., target) position to an actual position due to these factors cannot be predicted with any great consistency. Indeed, die shift can vary from one panel to the next, can vary from one unit to the next on a single panel (e.g., between two IC packages fabricated on the same panel), and/or can vary within a single unit (e.g., from one host die to the next in a single IC package that includes multiple host dies).

Figure 2:
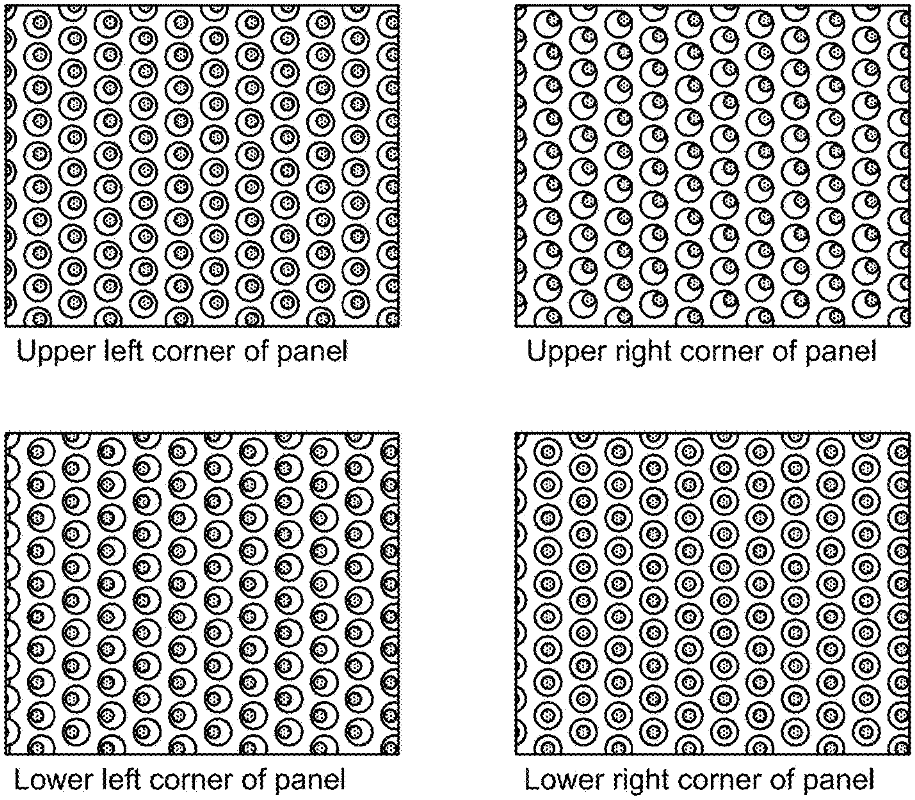
FIG. 2 (Prior Art)
FIG. 2 illustrates variations in the alignment or overlay of vias relative to corresponding pads on host dies fabricated according to the known techniques of FIG. 1.

Variations in the alignment or overlay (OL) of the vias 106 to the pads 104 of the host die 102 across an actual panel is represented in FIG. 2. Specifically, FIG. 2 is based on an optical micrograph image of the via holes (prior to being filled with metal) over host dies 102 positioned in four different quadrants of a panel. In FIG. 2, the larger circles represent the pads 104 on the host die 102 at the bottom of the vias and the smaller (shaded) circles represent the holes in the dielectric material 108 corresponding to the vias 106. As shown, the via holes are substantially aligned with the pads 104 in the lower right corner of the panel but are at least somewhat misaligned in each of the other quadrants. Inasmuch as die shift can vary across a single panel, as shown in FIG. 2, and can vary from one panel to another, there is no reliable laser or lithographically based process that can predictably correct such die shifting. In some instances, the amount of die shift can be more significant than what is shown in FIG. 2 to the point that at least a portion of the vias 106 and corresponding pads 104 do not overlap, thereby resulting in reliability issues for the associated electrical connections intended to be provided through the vias 106 and pads 104. Indeed, die shift can be so significant that the vias 106 end up being completely misaligned with an intended pad 104 such that an electrical connection between the via 106 and the pad 104 is never created. Additionally or alternatively, significant die shift may result in a via 106 becoming electrically coupled with the wrong pad 104.

The amount of die shift that is acceptable is a function of the critical dimensions of the pads 104 and vias 106 as well as the spacing or pitch of the pads 104 and vias 106. Typically, the pads 104 have a generally circular shape such that the critical dimension for the pads 104 is the pad diameter 114. The vias 106 are also generally circular in shape but often have a tapered wall such that the diameter of the via 106 at a point farthest away from the host die 102 (commonly referred to as the top diameter 115) is larger than the diameter of the via 106 directly adjacent the host die 102 (commonly referred to as the bottom diameter 116). Inasmuch as the bottom diameter 116 defines the area of alignment and/or overlap with a corresponding pad 104 on the host die 102, the critical dimension of the via 106 is the bottom diameter 116. In some instances, as shown in FIG. 1, the bottom diameter 116 is designed to be smaller than the diameter 114 of the pads 104. In this manner, some shift in the host die is tolerable because the interface between the pad 104 and an associated via 106 can remain in overlapping relationship (e.g., without the via 106 extend beyond the perimeter of an intended pad 104, thereby risking contact with an adjacent pad 104 and/or an unreliable connection with the intended pad 104). However, the relatively small bottom diameter 116 of the via 106 is becoming a limiting factor to the reliability of connections between the via 106 and the pad 104 even when fully overlapping with the pad 104. Furthermore, this becomes an even greater concern as the size of the pads 104 and the associated vias 106 continue to scale down. On the other hand, increasing the bottom diameter 116 of the vias 106 relative to the diameter 114 of the pads 104 reduces the amount of die shift that is acceptable to ensure a via 106 does not extend beyond the perimeter of a corresponding pad 104. Stated differently, as the bottom diameter 116 of the vias 106 increases relative to the diameter 114 of the pads 102, the precision or degree of alignment or overlay between the vias 106 and the underlying pads 102 needs to increase.

Figure 3:
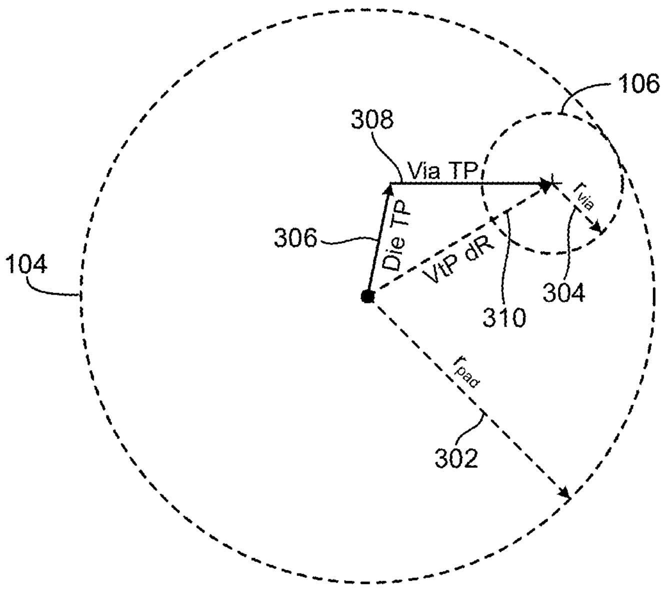
FIG. 3 is a diagram demonstrating the basis for and resulting extent of misalignment between vias and underlying pads of host dies.

The precision of the alignment of the vias 106 relative to the pads 102 (and the corresponding threshold tolerance of die shift and/or misplacement of the die) is diagrammatically demonstrated with reference to FIG. 3. In FIG. 3, the larger circle represents the size of a pad 104 on the host die 102 with the smaller circle representing the size of the bottom of a corresponding via 102. Thus, as shown, the diameter 114 of the pad 104 (or corresponding pad radius ($r_{pad}$) 302) is larger than the bottom diameter 116 of the via 106 (or corresponding via radius ($r_{via}$) 304). The alignment (or misalignment) of the via 106 relative to the pad 104 is a function of the die true position (Die TP) 306 and the laser drill true position (which defines the via true position (Via TP) 308). This can be expressed mathematically as VtP dR=Die TP+Via TP, where VtP dR refers to the overall via to pad misalignment 310. The die TP 306 is itself a function of die placement accuracy and any subsequent die shift during the curing of the die adhesive film 112.

Figure 4:
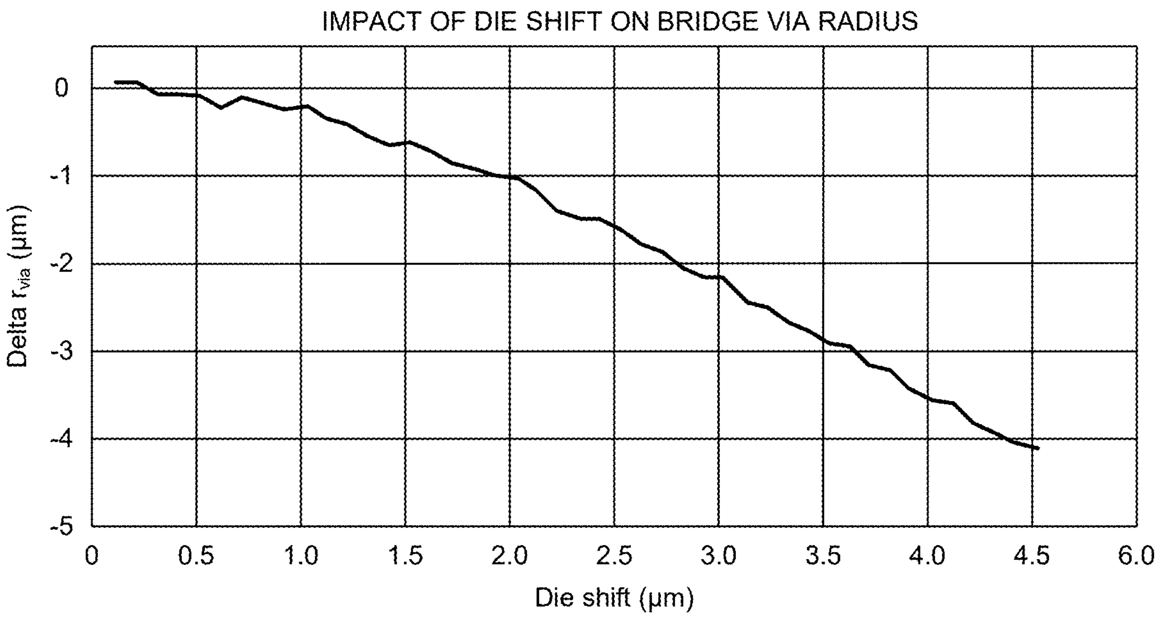
FIG. 4 is a graph representing simulated data showing the impact of die shift on the size of the via that can be associated with a particular pad on a host die.

The above factors that lead to some measure of misalignment between the via 106 and a corresponding pad 104 place a constraint on the upper limit of the bottom diameter 114 (or radius 304) of the via 106. In particular, as mentioned above, to ensure a reliable connection, the via 106 should not extend beyond the perimeter of the pad 104. Thus, the position of the via 106 represented in FIG. 3 is the farthest distance out of alignment with the pad 104 that is acceptable with the perimeter of the via 106 aligned with the perimeter of the pad 104. That is, any further misalignment of the via 106 relative to the pad 104 could result in fall off from the pad 104, thereby compromising the reliability of the via 106. Stated differently, assuming the overall via to pad misalignment 310 shown in FIG. 3 represents the largest expected misalignment, the maximum dimension of the via (e.g., the via radius 304) to avoid fall off is the difference between the pad radius 302 and the overall via to pad misalignment 310 (e.g., $r_{via} \leq r_{pad} - \text{VtP dR}$). Thus, to avoid reliability issues as die pads 104 get smaller (to accommodate smaller pitches) either the bottom dimension 116 (or corresponding radius 302) of the via 106 needs to get smaller or the overall amount of via to pad misalignment 310 needs to get smaller. FIG. 4 is a graph representing simulated data showing the impact of die shift on the size of the via that can be associated with a particular pad on a host die. As can be seen, as the amount of die shift increases, the constrained size of the via (e.g., $r_{via}$ 304) decreases.

Reducing the size of vias 106 is not a viable option because vias are already relatively small and making them smaller can create reliability issues even when the via is properly aligned with and fully overlapping a pad 104. Accordingly, examples disclosed herein enable larger bottom diameters 116 of vias 106 relative to the diameters 114 of corresponding pads 104 (that is, the vias 106 may increase in size for improved connection reliability and/or the pads 104 may reduce in size for higher density interconnections) by reducing the amount of die shift. Specifically, in examples disclosed herein, the host die 102 is rigidly attached to the die pad 110 (or other metallic structure) without the use and/or independent of an adhesive (e.g., the die adhesive film 112). That is, in some examples, there is no adhesive at the interface between a host die and a substrate in which the host die is embedded. Rather, in some examples, the host die 102 is attached to the die pad 110 via direct metal-to-metal fusion bonding of two metal surfaces associated with a single metal (e.g., direct copper-to-copper bonding). In some examples, the host die 102 is attached to the die pad 110 via eutectic fusion bonding through the use of a solder material (e.g., tin). Examples disclosed herein may be performed at the wafer level or the panel level. The direct metallic bonds of disclosed examples provide a rigid connection that is not subject to the shrinkage and/or warpage that occurs with a die adhesive film 112. As a result, once the host die 102 is positioned in place, it should not shift during subsequent processing, thereby reducing the amount of overall die shift. With less die shift, the maximum overall misalignment between vias 106 and pads 104 will reduce thereby enabling the size of the vias 102 to be increased relative to the size of the pads 104 for improved reliability.

Further, voids can form in the die adhesive film 112 used to secure host dies 102 in place under traditional approaches during subsequent fabrication processing (e.g., curing operations). Such voids can deleteriously affect the reliability of the host die 102. By eliminating the use of the die adhesive film 112, examples disclosed avoid this potentially source of failure. Furthermore, in some instances, electrical connections needs to be made with the host die 102 through the die adhesive film 112. To make such connections involves an extra processing operation of creating openings (e.g., via laser drilling) in the die adhesive film 112 to enable access to conductive contacts on the host die 102. By contrast, examples disclosed herein eliminate this extra processing operation thereby simplifying the overall fabrication process.

Additionally, in some examples, rather than transferring a host die (e.g., using a pick and place tool) directly to a panel (or wafer) containing an associated package substrate, the host die is transferred to a carrier and held in place by a temporary adhesive film. The host die (along with other host dies on the carrier) is then placed in alignment with a corresponding substrate on a panel (or wafer) by aligning the carrier with the panel. Using an intermediate carrier in this manner can reduce the amount of variation in the error of the placement or positioning of the host dies relative to their final positioning on corresponding substrates. As a result, examples disclosed herein further reduce misalignment between vias and associated host die pads, thereby enabling larger bottom diameters for the vias without a risk of fall off. In some examples, the reduction in misalignment enables the bottom diameter of the vias to be increased sufficiently to be equal to the top diameter of the vias. That is, whereas known implementations of vias are often tapered, examples disclosed herein enable the implementation of taperless vias. In some examples, the bottom diameter of a via may not be exactly the same size as the top via (e.g., there may be some tapering) but the bottom diameter may be substantially the same size as the top diameter. As used herein, the phrase "substantially the same size" means that the bottom diameter is at least 90% of the top diameter.

Figure 5:
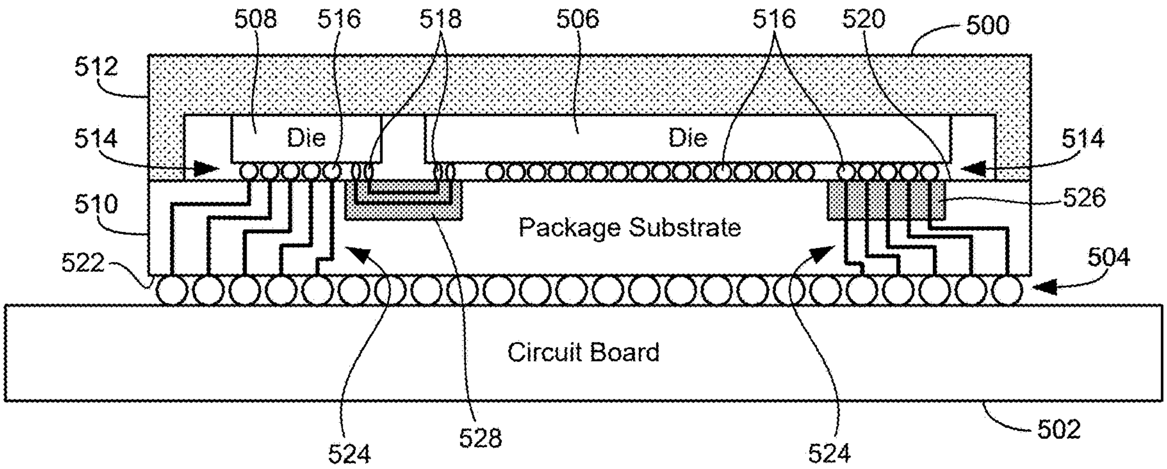
FIG. 5 illustrates an example integrated circuit (IC) package constructed in accordance with teachings disclosed herein.

FIG. 5 illustrates an example integrated circuit (IC) package 500 constructed in accordance with teachings disclosed herein. In the illustrated example, the IC package 500 is electrically coupled to a circuit board 502 via an array of bumps or balls 504 (e.g., a ball grid array). In some examples, the IC package 500 may include pins and/or pads, in addition to or instead of the balls 504, to enable the electrical coupling of the package 500 to the circuit board 502. In this example, the package 500 includes two semiconductor (e.g., silicon) dies 506, 508 that are mounted to a package substrate 510 and enclosed by a package lid or mold compound 512. While the example IC package 500 of FIG. 5 includes two dies 506, 508, in other examples, the package

500 may have only one die or more than two dies. The example IC package 500 and the associated circuit board 504 can be part of any electronic device such as, for example, a desktop computer, a laptop computer, a tablet, a smartphone, an Internet of things device, etc.

As shown in the illustrated example, each of the dies 506, 508 is electrically and mechanically coupled to the package substrate 510 through corresponding arrays of bumps 514. The electrical connections between the dies 506, 508 and the package substrate 510 (e.g., the bumps 514) are sometimes referred to as first level interconnects. By contrast, the electrical connections between the IC package 500 and the circuit board 502 (e.g., the balls 504) are sometimes referred to as second level interconnects. In some examples, one or both of the dies 506, 508 may be stacked on top of one or more other dies. In such examples, the dies 506, 508 are coupled to the underlying die through a first set of first level interconnects and the underlying die may be connected to the package substrate 510 via a separate set of first level interconnects associated with the underlying die. Thus, as used herein, first level interconnects refer to interconnects between a die and a package substrate or a die and an underlying die.

As shown in FIG. 5, the bumps 514 of the first level interconnects include two different types of bumps corresponding to core bumps 516 and bridge bumps 518. As used herein, core bumps 516 refer to bumps on the dies 506, 508 through which electrical signals pass between either one of the dies 506, 508 and components external to the IC package 500. Thus, as shown in the illustrated example, the core bumps 516 physically connected to the inner surface 520 of the substrate 510 are electrically coupled to the balls 504 on the external surface 522 of the substrate 510 through internal interconnects 524 within the substrate 510. In some examples, the internal interconnects 524 include traces defined in one or more layers of metal secured between one or more layers of organic dielectric material. In such examples, the traces in different metal layers are interconnected by metal vias extending therebetween. In some examples, as in the case with the second die 508 of FIG. 5, the internal interconnects 524 extend all the way through the substrate 510 between the inner surface 520 and the external surface 522 of the substrate 510. In some examples, as in the case with the first die 506 of FIG. 5, at least some of the core bumps 514 are electrically coupled to the internal interconnects 524 of the substrate 510 through a first host die 526 embedded in the package substrate 510. In this example, the first host die 526 is alternately referred to herein as a through silicon via (TSV) die because it includes vias extending through the host die 526. That is, as used herein, a TSV die is a host die that includes interconnects that extend between opposite surfaces of the die to electrically couple corresponding contacts, bumps, or pads on the opposite surfaces.

As used herein, bridge bumps 518 refer to bumps on the dies 506, 508 through which electrical signals pass between different ones of the dies 506, 508 within the package 500. Thus, as shown in the illustrated example, the bridge bumps 518 of the first die 506 are electrically coupled to the bridge bumps 518 of the second die 508 through a second host die 528 embedded in the package substrate 510. Additionally or alternatively, in some examples, different dies 506, 508 are electrically coupled through metal traces associated with the internal interconnects 524 in the substrate 510 independent of an embedded host die 528. The second host die 528 is alternately referred to herein as a bridge die because it provides interconnects that extend or provide a bridge between adjacent dies 506, 508. That is, as used herein, a bridge die is a host die that includes interconnects that extend between different points on the same surface of the die to electrically couple corresponding contacts, bumps, or pads on the surface of the die. As represented in FIG. 5, core bumps 516 are typically larger than bridge bumps 518.

Figure 6:
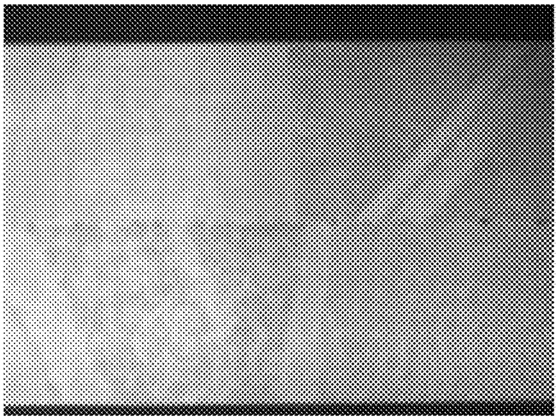
FIG. 6 is an SEM image of a cross-sectional view of an example copper-to-copper bond.
Figure 7:
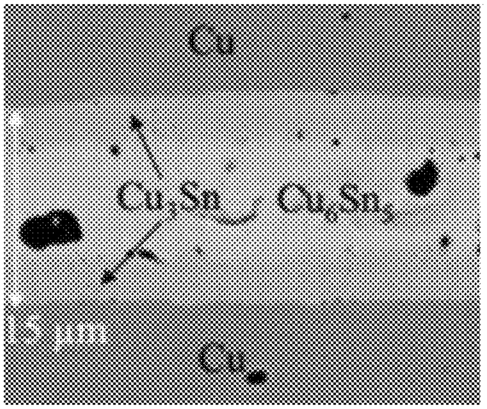
FIG. 7 is an SEM image of a cross-sectional via of an example copper-tin eutectic bond.

Unlike host dies (e.g., the host die 102 of FIG. 1) embedded in and attached to a substrate using traditional techniques (e.g., using the die adhesive film 112), the example TSV die 526 and the example bridge die 528 are attached to the substrate using low temperature copper-to-copper fusion bonding or a copper-tin eutectic fusion bonding. FIG. 6 is an SEM image of a cross-sectional view of an example copper-to-copper bond. FIG. 7 is an SEM image of a cross-sectional via of an example copper-tin eutectic bond. Using such bonding techniques can improve die placement accuracy and reduce (e.g., minimize) die shift during subsequent processing (e.g., curing operations). Further, in some examples, the host dies 526, 528 are initially positioned for the fusion bonding using a carrier assisted process that can provide for greater predictability in variation across a panel or wafer. The increased predictability in the variation enables such variation to be corrected for, thereby improving the overall alignment between vias and associated pads on the host dies 526, 528. Further detail regarding the fusion bonding process of the host dies 526, 528 is provided below.

Figure 8:
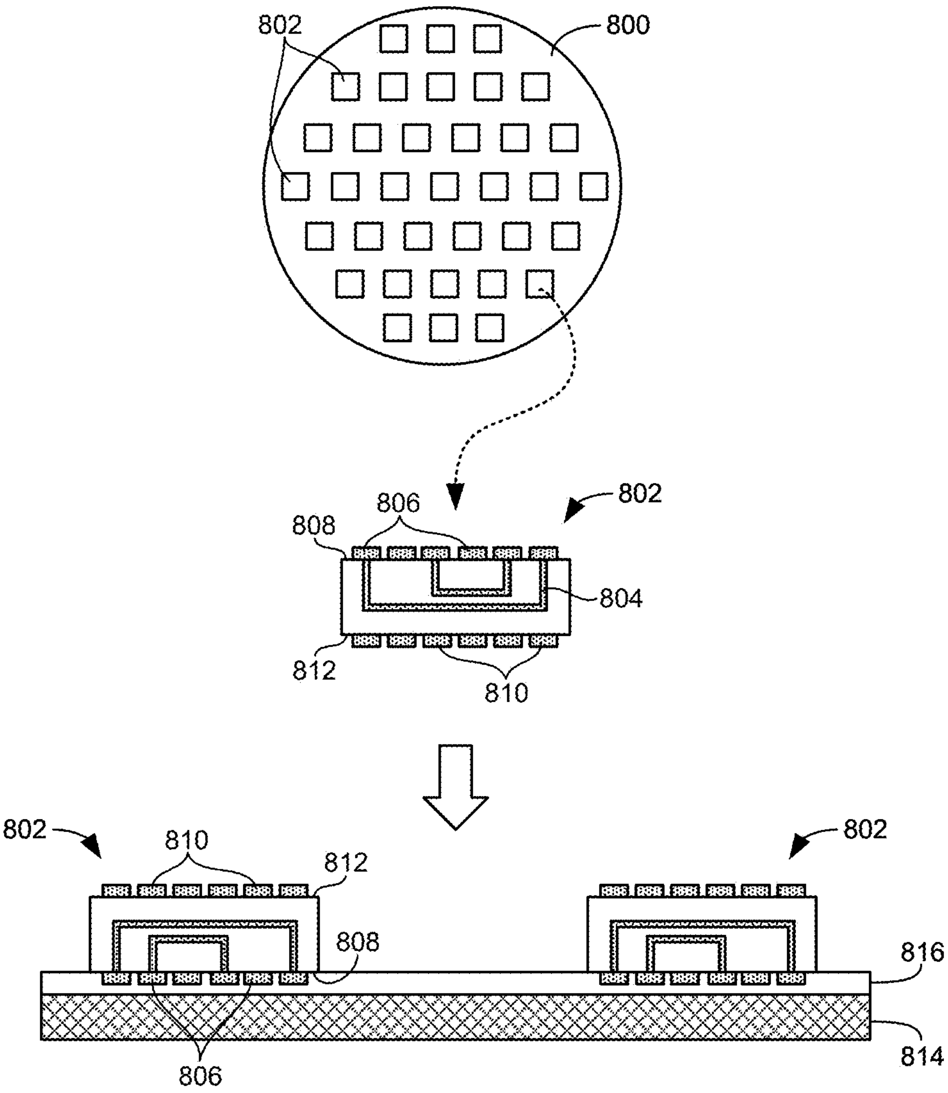
FIGS. 8-14 illustrate various stages in an example process of fabrication of the example substrate of FIG. 5.

In particular, FIGS. 8-14 illustrate various stages in an example process of fabrication of the example substrate 510 of FIG. 5. FIG. 8 represents a semiconductor (e.g. silicon) wafer 800 on which a plurality of host dies 802 have been fabricated. In this example, the host dies 802 are bridge dies as indicated by the fact that the internal interconnects 804 extend between different metal contacts, bumps. or pads 806 on a first (front) side 808 of the bridge dies 802. Thus, in this example, one of the bridge dies 802 corresponds to the bridge die 528 of FIG. 5. In this example, the pads 806 are comparable to the pads 104 on the host die 102 of FIG. 1. As shown in the illustrated example, each bridge die 802 includes one or more metal contacts, bumps, or pads 810 on a second (back) side 812 of the bridge die 802 opposite the first side 808. For purposes of explanation, the contacts 806 on the front side 808 of the bridge die 802 are referred to as pads, whereas the bumps 810 on the back side 812 of the bridge die 802 are referred to herein as bumps. However, the terms contacts, bumps, and pads, may be used interchangeably herein. Indeed, in some examples, the pads 806 and the bumps 810 have a similar size, shape, and structure. However, in other examples, the pads 806 on the front side of the bridge die 802 can differ in size, shape, and/or structure relative to the bumps 810. In this example, the number of bumps 810 on the second side 812 matches the number of pads 806 on the first side 808. However, in other examples, the number of bumps 810 on the second side 812 can be greater or fewer than the number of pads 806 on the first side 808. For instance, in some examples, a single contact 810 may extend continuously across the second side 812 of the bridge die 802. In some examples, the pads 806 and the bumps 810 are made of copper.

As further represented in FIG. 8, individual ones of the bridge dies 802 are transferred to a carrier 814 (sometimes referred to as a carrier patch) using a pick and place tool. In some examples, the transfer of the bridge dies 802 is performed after the dies 802 have been tested such that only the known good dies are transferred to the carrier 814. In some examples, the carrier 814 is a glass carrier. As shown in the illustrated example, the bridge dies 802 are secured to the carrier 814 using a temporary adhesive film 816. More particular, as shown in FIG. 8, the bridge dies 802 are bonded to the carrier 814 such that the front side 808 (which includes the pads 806) is adjacent the carrier 814 with the back side 812 (which includes the bumps 810) of the bridge dies 802 facing away from the carrier 814. In some examples, the positioning of the bridge dies 802 on the carrier 814 is based on the design rule, shrinkage scaling, offset and rotation associated with the underlying wafer and/or panel supporting the substrates to which the bridge dies 802 are ultimately to be attached. Thus, the use of the carrier 814 can reduce potential inaccuracies in die placement that exist in current approaches in which a pick and place tool transfers host dies directly onto a substrate supported by a wafer or panel.

Figure 9:
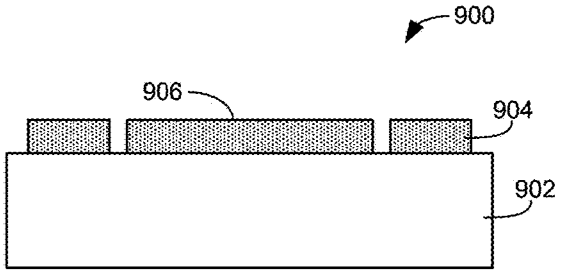

FIG. 9 illustrates a portion of an example package substrate 900 that may be implemented for the example substrate 510 of FIG. 5. In the illustrated example of FIG. 9, the substrate 900 is fabricated up to the point where the substrate 900 is ready to receive the bridge die 802 of FIG. 8 transferred thereon. In particular, the example substrate 900 includes a substrate core 902 that can include one or more redistribution layers (RDLs) therein. Further, the substrate 900 includes a metal layer 904 that has been patterned to includes an example die pad 906. The example die pad 906 of FIG. 9 is comparable to the die pad 110 of FIG. 1. Reliable metallurgic fusion bonds between two copper interfaces (both in terms of structural integrity as well as electrical behavior) can be undermined by undulations and/or micro-roughness along the interfacing surfaces. Further, oxide and/or other foreign materials on the surface can deleteriously impact the interfacial strength and electrical properties of a copper-to-copper fusion bond. Accordingly, in some examples, the die pad 906 is processed to reduce these effects by performing a planarization and/or chemical mechanical polishing procedure. Such procedures can control undulations and roughness down to the submicron scale. Further, in some examples, a wet (chemical) process involving formic acid reflow and plasma activation can be used to remove any oxide or foreign materials. In some examples, these same processes to reduce undulations and roughness and ensure the cleanliness (e.g., removal of oxide and foreign materials) are also applied to the surface of the bumps 810 of the bridge die 802 shown in FIG. 8.

Figure 10:
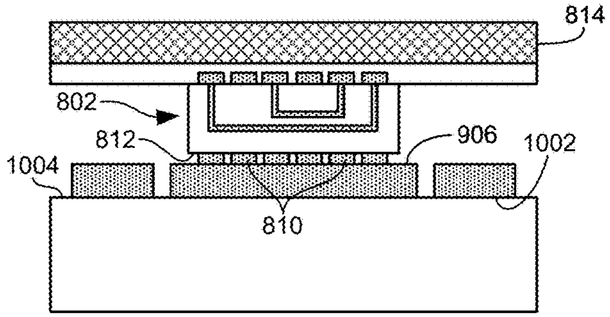

Once the surface of the bumps 810 on the bridge die 802 and the surface of the die pad 906 on the substrate 900 have been prepared as outlined above, the bumps 810 of the bridge die 802 are positioned to interface with the die pad 906 of the substrate 900 as represented in FIG. 10. More particularly, in some examples, the particular position of the bridge die 802 relative to the corresponding die pad 906 is controlled by aligning fiducial marks on the panel or wafer (supporting the substrate 900) with corresponding fiducial marks on the carrier 814 used to transfer the bridge die 802. As noted above, multiple different bridge dies 802 are typically positioned in proper alignment with corresponding die pads 906 of separate substrates 900 at a single time. Once the bridge die 802 is properly aligned with a corresponding die pad 906, the carrier 814 and the panel supporting the substrate 900 are clamped together to apply pressure at the interface between the bumps 810 of the bridge die 802 and the die pad 906 of the substrate 900. In some examples, while clamped together, the assembly is placed in a vacuum furnace at an elevated but still relatively low temperature (e.g., around 150° C.) for an extend period of time (e.g., around 30 minutes) to promote the diffusion bonding at the interface of the mating copper surfaces. More particularly, the copper-to-copper diffusion bonding achieved by this process is a spontaneous adhesion of hydrophilic surfaces followed by a copper diffusion across the bonding surfaces (also known as grain boundary diffusion). In some examples, after this initial application of heat and pressure to establish the metallurgical bonds, the assembly undergoes a further heat treatment (annealing) process to remove residual stress and promote further grain growth, thereby improving the interfacial strength of the bond as well as its electrical conductivity. In some examples, the annealing process is performed at a temperature around 200° C. for around 30 minutes.

The resulting joint or bond between the bridge die 802 and the die pad 906 from the above process includes copper that extends continuously across a full distance between the back side 812 of the bridge die 802 and a distal side 1002 of the metal layer 904 (e.g., corresponding to a facing surface 1004 of the substrate core 902 on which the die pad 906 is supported). That is, the joint or bond does not include any organic material or other die adhesive film (e.g., the die adhesive film 112). As noted above, an SEM image of an example of such a bond is shown in FIG. 6. Such a direct, metallurgical bond between the interfacing surfaces of copper provides a much more rigid joint than is possible using the die adhesive film 112 discussed above in connection with FIG. 1. As a result, there is less concern of the bridge die 802 shifting relative to the substrate 900 during subsequent processing. In other words, the position of the bridge die 802 when initially transferred to the die pad 906 via the glass carrier 814 will be the position of the bridge die 802 through the rest of the fabrication process.

Figure 11:
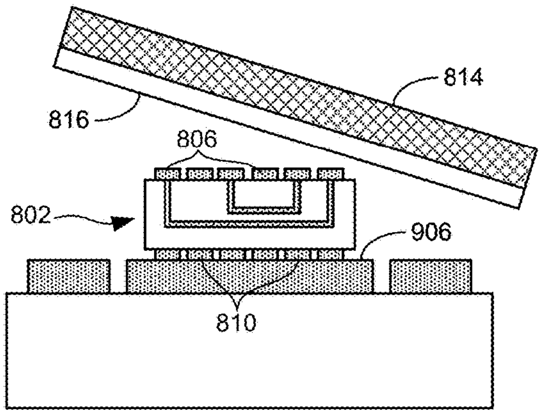

FIG. 11 represents the removal of the glass carrier 814 (and the associated temporary adhesive film 816) after the direct copper-to-copper bond has been established between the bumps 810 on the bridge die 802 and the die pad 906 on the substrate 900. In some examples, the carrier 814 is removed through a laser debond process in which the focus and intensity of a laser is controlled so that the laser energy is concentrated at the interface between the carrier 814 and the temporary adhesive bond 816. In some such examples, the laser will be defocused and have much less intensity by the time it reaches the bridge die 802 such that the bridge die 802 will be unaffected by the process. Following this debonding process, the pads 806 on the bridge die are cleaned to remove any organic residue from the temporary bonding film 816.

Figure 12:
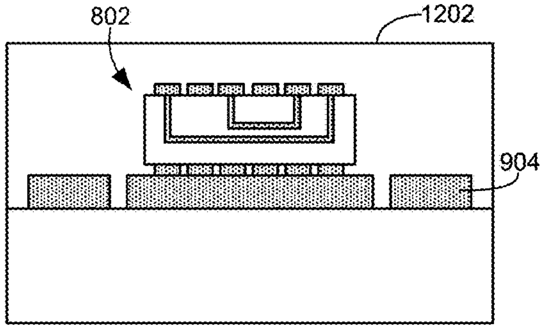
Figure 13:
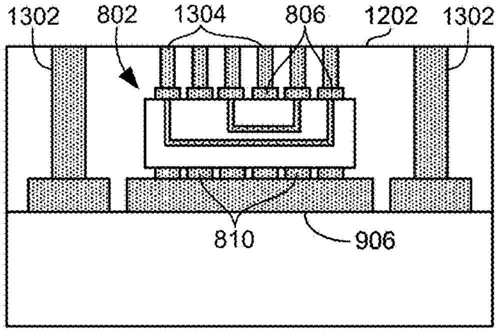
Figure 14:
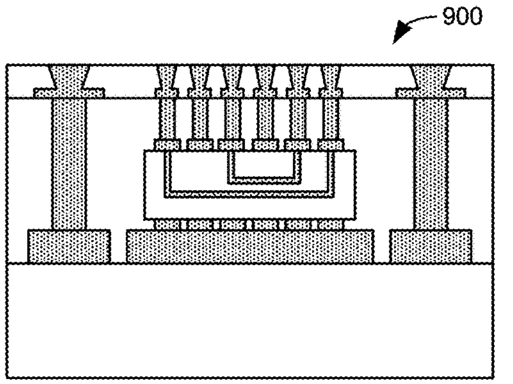

The remaining processes represented by FIGS. 12-14 correspond to standard fabrication processes for an embedded host die. In particular, as represented in FIG. 12, a dielectric layer 1202 (e.g., a phot film resist) is laminated and cured to encapsulate the bridge die 802 and the metal layer 904. FIG. 13 represents the stage in the fabrication process after the photo resist film has been patterned with openings (using laser drilling and/or lithography techniques), which have been filled with metal. More particular in this example, tall pillar vias 1302 are positioned adjacent the bridge die 802 and individual vias 1304 are positioned to align with corresponding ones of the pads 806 on the bridge die 802. In this examples, the alignment between the vias 1304 and the pads 806 following the above procedures will be significantly better than using existing techniques because there will be little to no die shift between the bridge die 802 because of the rigid metallurgical bond between the bumps 810 of the bridge die 802 and the underlying die pad 906. Further, alignment will be improved (relative to existing techniques) because the transfer of the host dies 802 first to the glass carrier 814 and then from the carrier 814 to the substrate 900 can compensate for panel warpage that is not feasible using existing techniques. FIG. 14 represents the final structure of the substrate 900 after another layer of resin 1402 is laminated and patterned to create fan out structures for 2D and/or 2.5D integration with separate dies (e.g., the dies 506, 508) of FIG. 5. In some examples, the fan out provides a finer bump pitch scaling from approximately 55 μm down to 30 μm or less. In some examples, as mentioned above, the processes associated with FIGS. 8-14 can be implemented at a wafer or panel level. Accordingly, a singulation process may follow to separate different portions of the substrate 900 on the wafer or panel into individual units associated with individual IC packages (e.g., the IC package 500 of FIG. 5).

Figure 15:
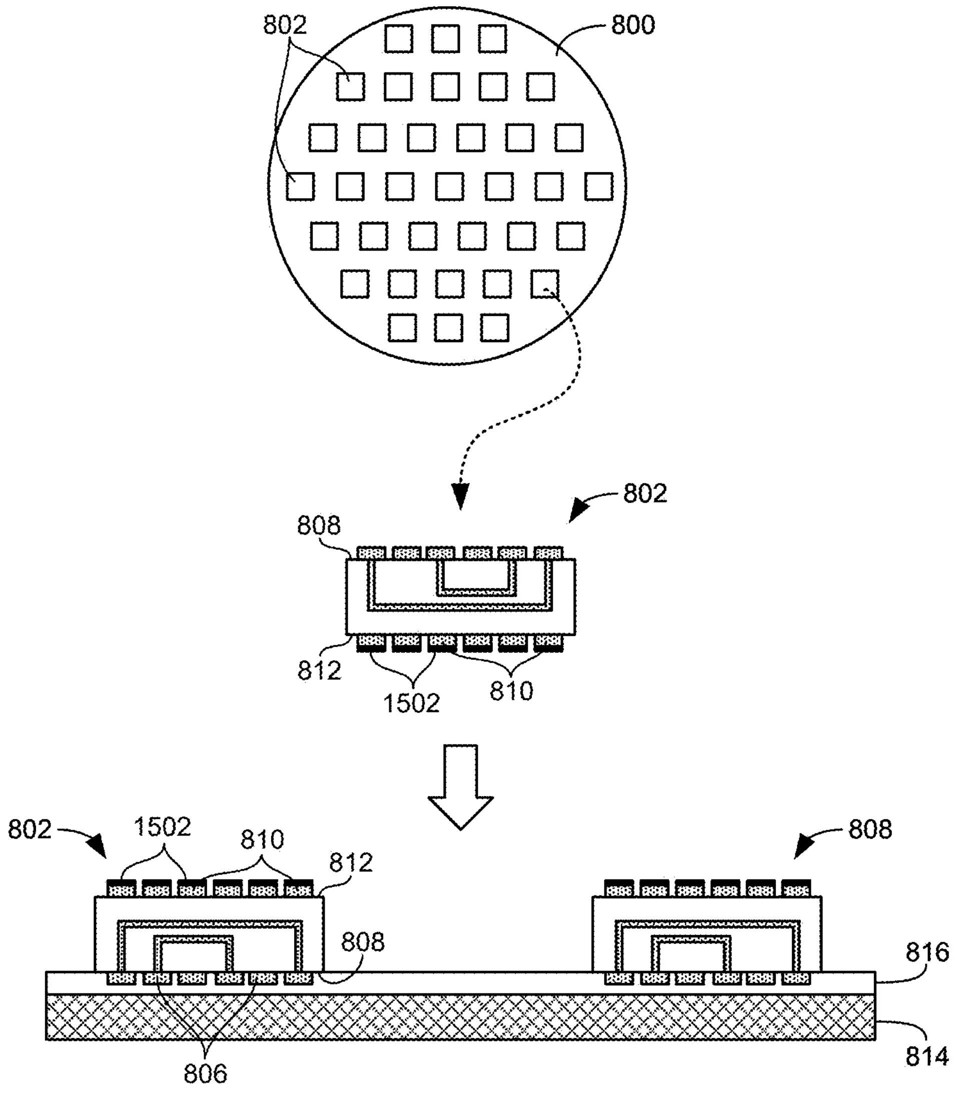
FIGS. 15-21 illustrate various stages in another example process of fabrication of the example substrate of FIG. 5.

FIGS. 15-21 illustrate various stages in another example process of fabrication of the example substrate 510 of FIG. 5. The example fabrication process represented in FIGS. 15-21 is substantially the same as the example process detailed above in connection with FIGS. 8-14. Accordingly, the same reference numerals used in FIGS. 8-14 will be used to identify the same components represented in FIGS. 15-21. Although similar, the example fabrication process represented in FIGS. 15-21 differs from FIGS. 8-14 in how the contacts or bumps 810 on the back side 812 of the bridge die 802 are manufactured and subsequently bonded to the die pad 906 of the substrate 900. In particular, as shown in the illustrated example of FIG. 15, when the bridge die 802 is fabricated on a semiconductor wafer 800, a layer of tin 1502 is deposited on the underlying copper portion of the bumps 810. In some examples, a nickel barrier layer is positioned between the copper and the tin 1502. Once the bridge die 802 is fabricated it is moved to a glass carrier 814 and held in place by a temporary adhesive film 816 as shown in FIG. 15 and discussed in further detail in connection with FIG. 8.

Figure 16:
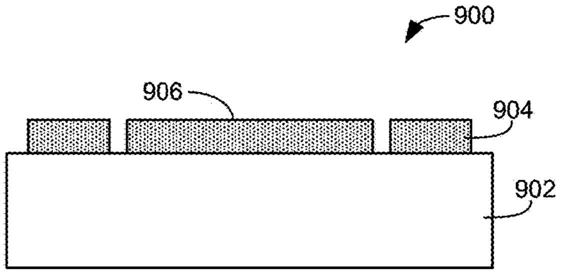
Figure 17:
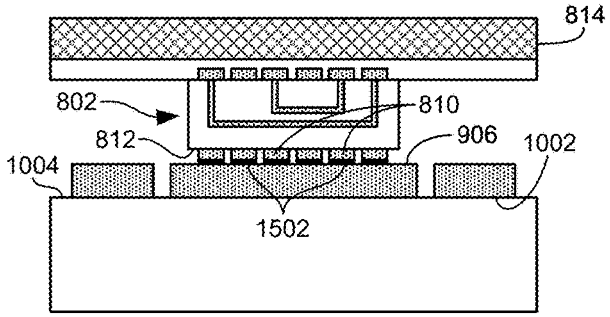
Figure 18:
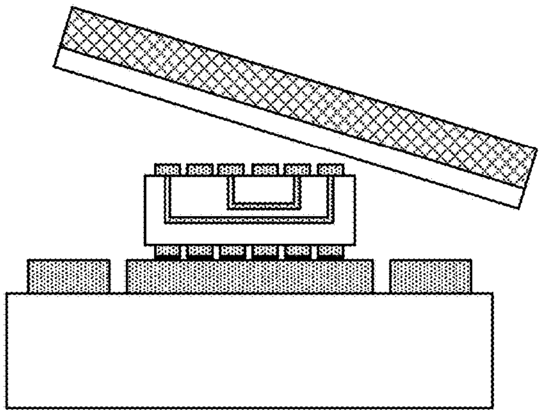
Figure 19:
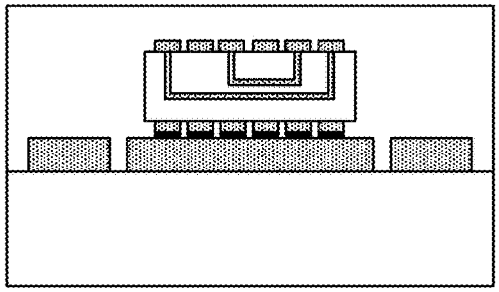
Figure 20:
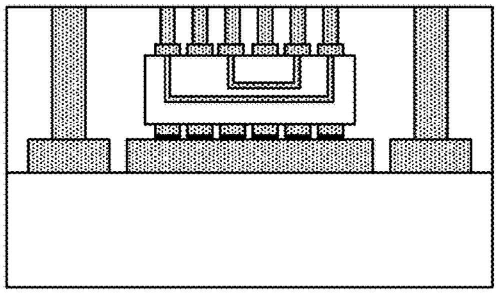

FIG. 16 is the same as FIG. 9 and illustrates a portion of an example package substrate 900 that may be implemented for the example substrate 510 of FIG. 5. As described above in connection with FIG. 9, the copper surface on the die pad 906 is treated to reduce undulations and roughness and to remove any oxide or foreign materials. However, unlike in the process described with respect to FIG. 9, in the illustrated example of FIGS. 15-21, the bumps 810 on the bridge die 802 are not similarly treated because they include the tin 1502, which will enable the bond between the components. However, in some examples, the bumps 810 still undergo a wet chemical process (e.g., formic acid reflow) to ensure the surface of the bumps 810 are clean and free of foreign materials. In the illustrated example of FIG. 17, the glass carrier 814 is aligned with the panel (or wafer) carrying the substrate 900 so as to position the bridge die 802 in alignment with the die pad 906 as detailed above in connection with FIG. 10. In this example, the tin 1502 on the bumps 810 is positioned directly adjacent the copper surface of the die pad 906. In the illustrated example, pressure and heat is applied to promote copper-tin eutectic fusion bonding. More particularly, while clamped together, the assembly is placed in a vacuum furnace at an elevated temperature (e.g., around 230° C.) for an extend period of time (e.g., around 45 minutes to 1 hour) to promote the diffusion bonding at the interface of the mating copper surfaces. That is, during this process, the tin 1502 melts and reacts with the copper of the bumps 810 as well as the copper of the die pad 906 during which the copper diffuses into the tin 1502, which results in a copper-tin (e.g., $Cu_3Sn$, $Cu_6Sn_5$) intermetallic phase at the joint region. Thus, in this example, the joint or bond between the bridge die 802 and the die pad 906 is metal continuously across a full distance between the back side 812 of the bridge die 802 and the distal side 1002 of the metal layer 904 (e.g., corresponding to the facing surface 1004 of the substrate core 902 underlying the die pad 906).

That is, the joint or bond is created independent of and/or without an adhesive (e.g., the die adhesive film 112) at the point of bonding. Unlike the bond described above in connection with FIG. 10 (which includes exclusively copper), the joint or bond of continuous metal in the example of FIG. 17 includes regions of copper with a region of a copper-tin intermetallic phase positioned therebetween. As noted above, an SEM image of an example of such a bond is shown in FIG. 7. Such a direct, metallurgical bond between the interfacing surfaces of copper provides a much more rigid joint than is possible using the die adhesive film 112 discussed above in connection with FIG. 1. As a result, there is less concern of the bridge die 802 shifting relative to the substrate 900 during subsequent processing. In other words, the position of the bridge die 802 when initially transferred to the die pad 906 via the glass carrier 814 will be the position of the bridge die 802 through the rest of the fabrication process.

Figure 21:
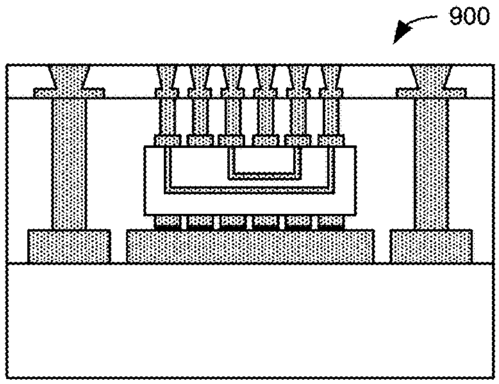

FIGS. 18-21 represent stages of the fabrication process that involve the same processes and operations as discussed above in connection with FIGS. 11-14 to arrive at the final structure of the substrate 900 as shown in FIG. 21. Accordingly, a detailed description of FIGS. 18-21 is not provided herein so as to avoid redundancy.

FIGS. 22-28 illustrate various stages in another example process of fabrication of the example substrate 510 of FIG. 5. The example fabrication process represented in FIGS. 15-21 is substantially the same as the example process detailed above in connection with FIGS. 8-14. Accordingly, the same reference numerals used in FIGS. 8-14 will be used to identify the same components represented in FIGS. 22-28. Although similar, the example fabrication process represented in FIGS. 22-28 differs from FIGS. 8-14 in the nature of the host die embedded in the example substrate 510. Specifically, as shown in the illustrated example of FIG. 22, an example silicon wafer 2200 includes a plurality of host dies 2202 that are TSV die (instead of being bridge dies 802 as shown in FIG. 8). Thus, in this example, one of the TSV dies 2202 corresponds to the TSV die 526 of FIG. 5. The TSV dies 2202 include internal interconnects 2204 corresponding to vias that extend all the way through the dies between first contacts, bumps, or pads 2206 on a first (front) side 2208 of the TSV dies 2202 to second contacts, bumps, or pads 2210 on a second (back) side 2212 of the TSV dies 2202. Similar to the description associated with FIGS. 8-14, for purposes of explanation, the contacts on the front side 2208 are referred to herein as pads 2206, whereas the contacts on the back side 2212 are referred to herein as bumps 2210. In this example, the pads 2206 are comparable to the pads 104 on the host die 102 of FIG. 1.

Figure 23:
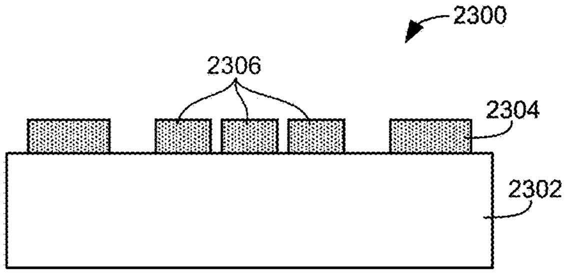
Figure 24:
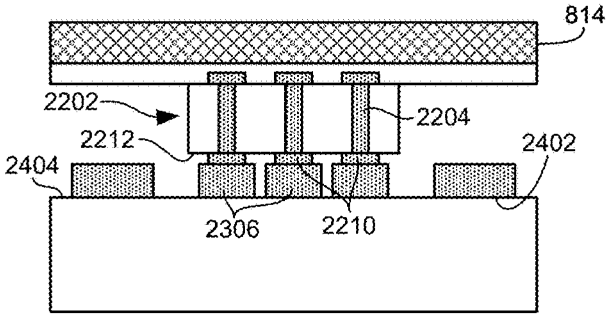
Figure 25:
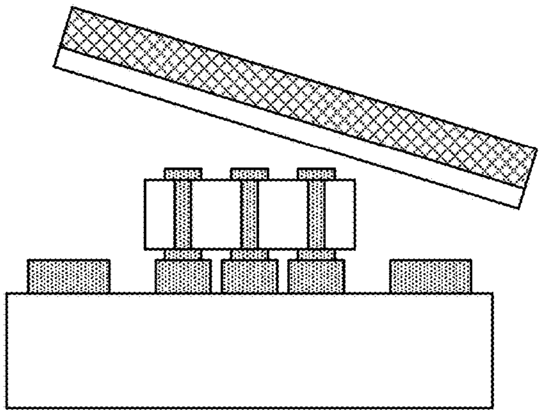
Figure 26:
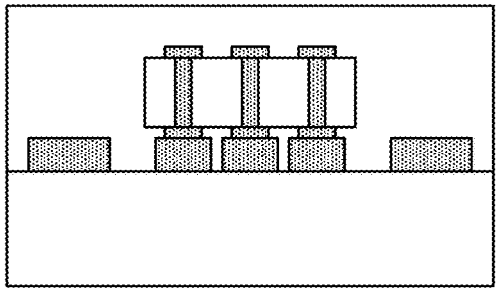
Figure 27:
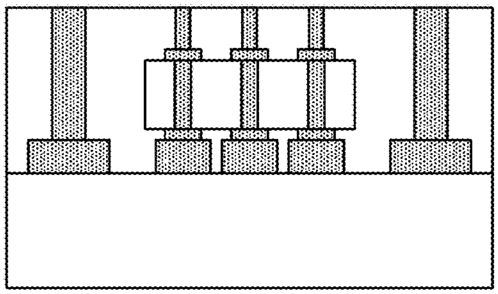

In this example, the TSV dies 2202 are transferred to and positioned on a substrate using a glass carrier 814 in the same manner as discussed above in connection with FIG. 8. FIG. 23 illustrates an example substrate 2300 to which the TSV die 2202 is to be transferred. As with the substrate 900 of FIG. 9, the substrate 2300 of FIG. 23 includes a substrate core 2302 with a metal layer 2304 disposed thereon. However, unlike the substrate 900 of FIG. 9 that includes a single die pad 906, the example substrate 2300 the metal layer 2304 includes an array of metal contacts 2306. In this example, each of the contacts 2306 in the array is positioned to align with a corresponding one of the bumps 2210. That is, as shown in FIG. 24, when the glass carrier 814 is aligned with the panel and/or wafer supporting the substrate 2300 (as detailed in connection with FIG. 10), the bumps 2210 on the TSV die 2202 interface with corresponding ones of the contacts 2306 in the metal layer 2304 of the substrate 2300.

Separate contacts 2306 are used in the illustrated example of FIGS. 22-28 to enable each of the vias 2204 within the TSV die 2202 to be used as a separate path for electrical current. The die pad 906 of FIG. 9 is not used to conduct an electrical current and, therefore, does not need to be divided into separate segments. However, in some examples, the bridge die 802 of FIGS. 8-14 is attached to multiple distinct segments of metal rather than a single die pad 906 as shown. Notably, if the TSV die 2202 were attached to the contacts 2306 using existing approaches that involve the use of a die adhesive film (as discussed in FIG. 1), the adhesive would separate the bumps 2210 on the TSV die 2202 from the contacts 2306 on the substrate 2300, thereby preventing their direct electrical coupling. Accordingly, additional fabrication processes that involve laser drilling openings in the adhesive to then establish electrical connections are necessary. By directly bonding the metal bumps 2210 on the TSV die 2202 to the contacts 2306 on the substrate eliminates the need for these extra processing operations. Furthermore, direct metal-to-metal (e.g., copper-to-copper) fusion bonds can improve mechanical joint reliability relative to an adhesive bond.

As shown in the illustrated example of 24, the bumps 2210 on the TSV die 2202 are bonded to the contacts 2306 of the substrate 2300 with a direct copper-to-copper fusion bond as described above in connection with FIGS. 8-14. The resulting joint or bond between the TSV die 2200 and the contact pads 2306 includes copper that extends continuously across a full distance between the back side 812 of the bridge die 802 and a distal side 2402 of the metal layer 904 (e.g., corresponding to a facing surface 2404 of the substrate core 902) without any organic material or other die adhesive film (e.g., the die adhesive film 112). As noted above, such a direct, metallurgical bond between the interfacing surfaces of copper provides a much more rigid joint than is possible using the die adhesive film 112 discussed above in connection with FIG. 1.

Figure 22:
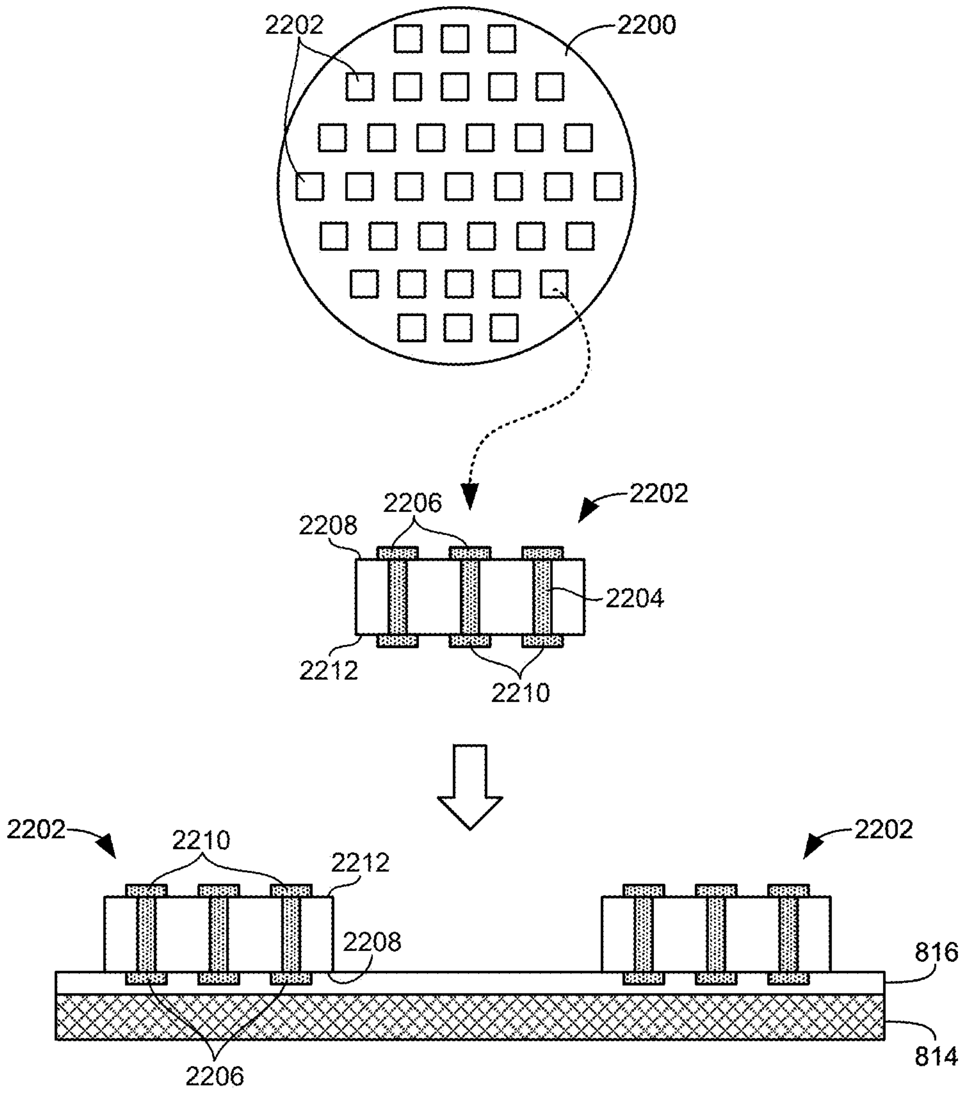
FIGS. 22-28 illustrate various stages in another example process of fabrication of the example substrate of FIG. 5.
Figure 28:
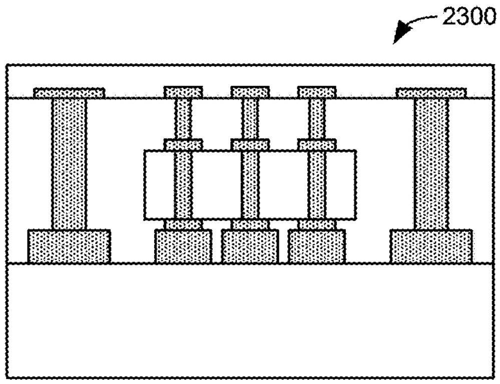

FIGS. 25-28 represent stages of the fabrication process that involve the same processes and operations as discussed above in connection with FIGS. 11-14 to arrive at the final structure of the substrate 2300 as shown in FIG. 28. Accordingly, a detailed description of FIGS. 25-28 is not provided herein so as to avoid redundancy. Furthermore, in some examples, the TSV dies 2202 shown in FIG. 22 are modified such that the bumps 2210 are fabricated to include tin deposited on the copper in a similar manner as discussed above in connection with FIG. 15. Such a TSV die 2202 is attached to the contacts 2306 on the substrate 2300 with a copper-tin eutectic fusion bond as described above in further detail in connection with the example fabrication process of FIGS. 15-21.

The above examples have been described with respect to metallurgical bonds between copper surfaces. However, other metals may be joined together with a direct metal fusion bond without the use of an adhesive. Further, other intermetallic phases between other types of metal (e.g., gold and tin, gold and indium, indium and tin, etc.) may alternatively be used to create metallurgical bonds without the use of an adhesive.

Figure 29:
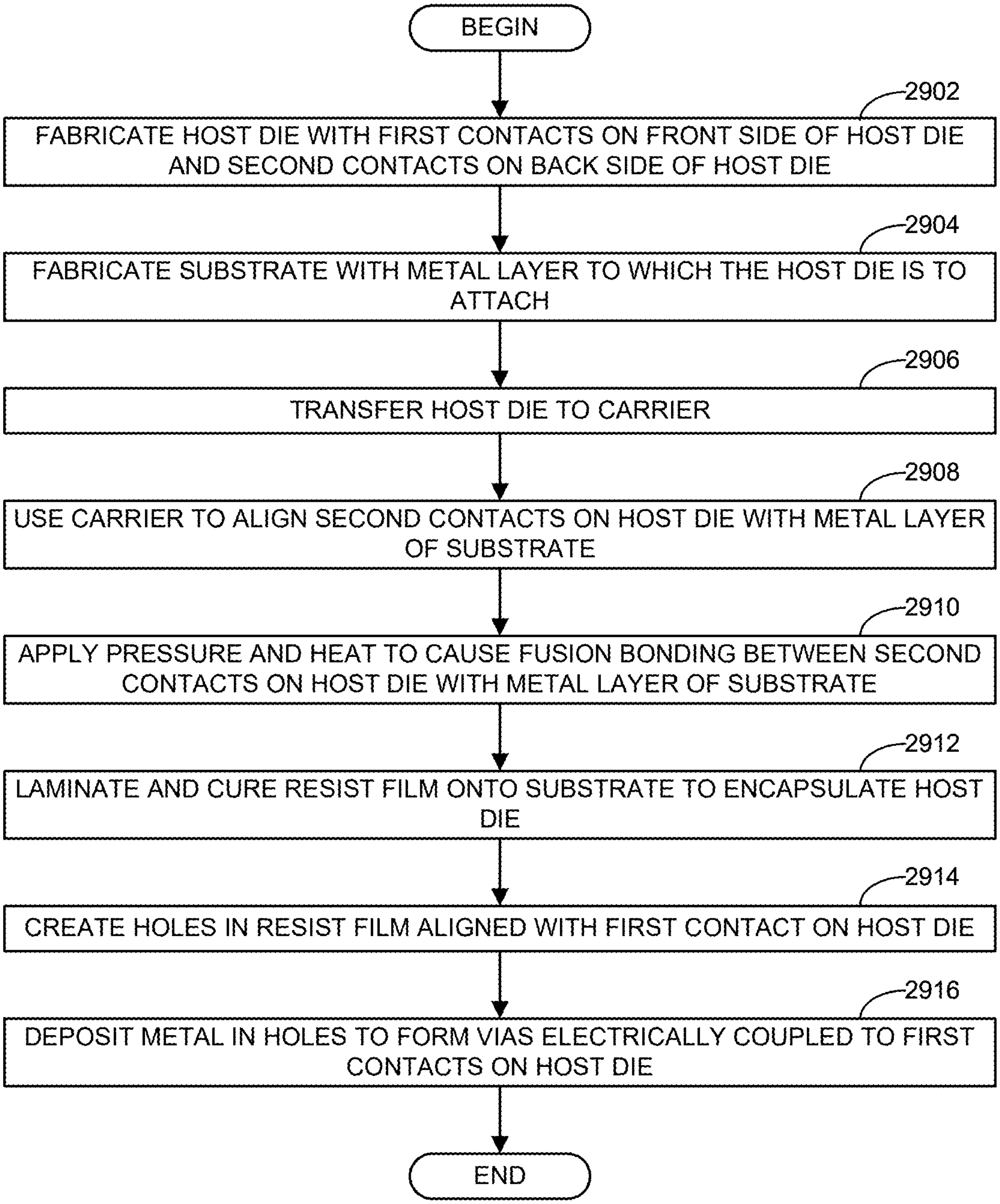
FIG. 29 is a flowchart representative of an example method of manufacturing the example substrate of FIG. 5 in accordance with the example bonding techniques described in connection with FIGS. 8-14, FIGS. 15-21, and/or FIGS. 22-28.

FIG. 29 is a flowchart representative of an example method of manufacturing the example substrate 510 of FIG. 5 in accordance with the example bonding techniques described in connection with FIGS. 8-14, FIGS. 15-21, and/or FIGS. 22-28. In some examples, some or all of the operations outlined in the example method are performed automatically by fabrication equipment that is programmed to perform the operations. Although the example method of manufacture is described with reference to the flowchart illustrated in FIG. 29, many other methods may alternatively be used. For example, the order of execution of the blocks may be changed, and/or some of the blocks described may be combined, divided, re-arranged, omitted, eliminated, and/or implemented in any other way.

The example method of FIG. 29 begins at block 2902 by fabricating a host die with first contacts on a front side of the host die and second contacts on a back side of the host die. In some examples, the host die is a bridge die (e.g., the bridge dies 528, 802 of FIGS. 5 and 8). In some examples, the host die is a TSV die (e.g., the TSV dies 526, 2200 of FIGS. 5 and 22). In some examples, the second contacts are copper and include an exposed copper surface. In other examples, the second contacts are copper but include a layer of tin on the outward facing surface of the copper. At block 2904, the example method includes fabricating a substrate with a metal layer to which the host die is to attach. In some examples, the substrate can correspond to anyone of the substrates 510, 900, 2300 of FIGS. 5, 9, 16, and 23 with the metal layer corresponding to the metal layers 904, 2304 of FIGS. 9, 16, and 23. At block 2906, the example method includes transferring (e.g., using a pick and place tool) the host die to a carrier (e.g., the glass carrier 814). In this example, the host die is secured to the carrier with a temporary adhesive film such that the back side of the host die faces away from the carrier.

At block 2908, the example method includes using the carrier to align the second contacts on the host die with the metal layer of the substrate. In some examples, the interfacing surfaces of the second contacts and the metal layer may be treated to clean such surface of oxide or foreign materials and/or the be planarized to reduce undulations and microroughness prior to the surfaces being mated together. At block 2910, the example method includes applying pressure and heat to cause fusion bonding between the second contact pads on the host die with the metal layer of the substrate. The particular nature of the pressure and heat treatment depends on the nature of the second contacts and the corresponding type of bond to be promoted. In particularly, if the second contacts include an exposed outer surface that is copper to achieve a direct copper-to-copper diffusion bond, the temperature can be limited to approximately 150° C. followed by an annealing process at approximately 200° C. By contrast, if the second contacts include a layer of tin on an underlying copper surface to achieve a copper-tin eutectic bond, the temperature used can be approximately 230° C. and can last for a longer duration than either of the two heat treatments associated with the direct copper-to-copper bonding.

At block 2912, the example method includes laminating and curing a resist film onto the substrate to encapsulate the host die. At block 2914, the example method includes creating holes in the resist film aligned with the first contacts on the host die. Inasmuch as the first contacts of the host die are covered by the resist film prior to the creation of the holes, alignment of the holes with the first contacts depends on the host die being in an expected (target) position. Through the use of the metallurgical fusion bonding between the second contacts of the host die and the metal layer of the substrate, the host die should not shift relative to the substrate once attached thereto. As such, the host die should be closer to the expected position than it would otherwise if the host die was attached to the substrate using an adhesive. Finally, at block 2916, the example method includes depositing metal in the holes to form vias electrically coupled to the first contacts on the host die. Thereafter, the example method of FIG. 29 ends and the resulting substrate with an embedded host die can be further processed by, for example, adding redistribution layers and electrically coupling other semiconductor dies to the substrate and/or the host die within the substrate.

Figure 30:
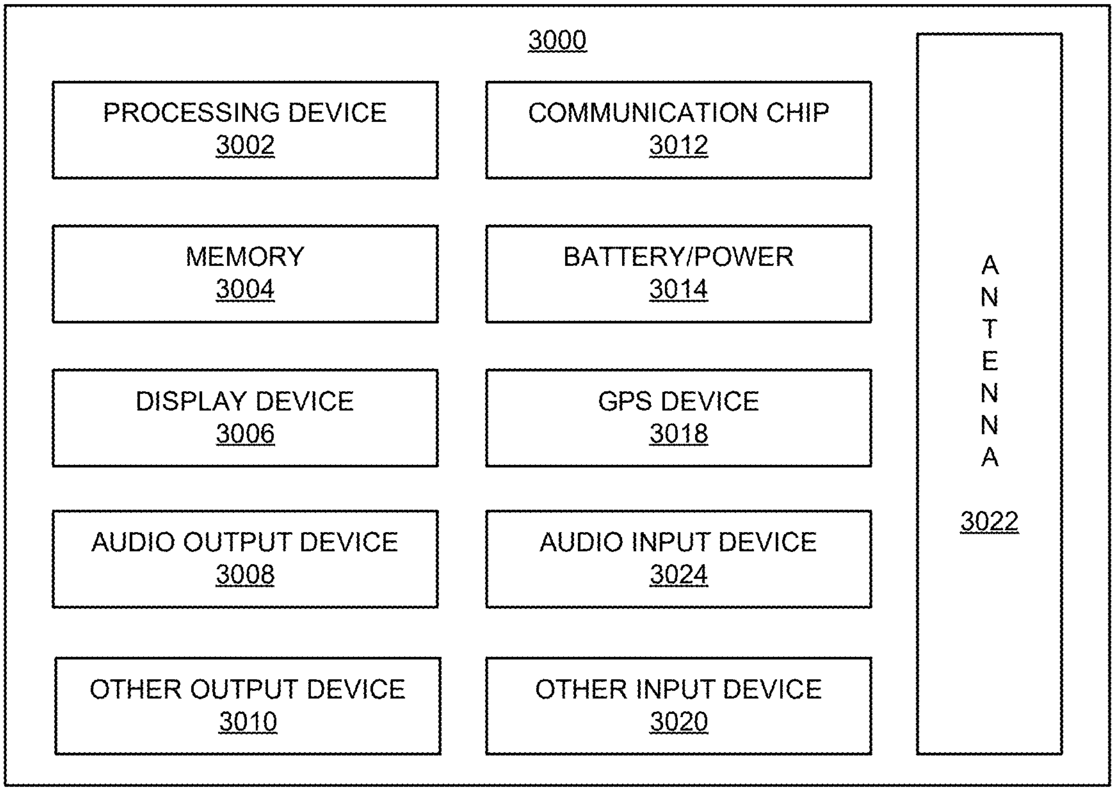
FIG. 30 is a block diagram of an example electrical device that may include the example IC package of FIG. 5.

FIG. 30 is a block diagram of an example electrical device 3000 that may include the example IC package 500 of FIG. 5. A number of components are illustrated in FIG. 30 as included in the electrical device 3000, but any one or more of these components may be omitted or duplicated, as suitable for the application. In some examples, some or all of the components included in the electrical device 3000 may be attached to one or more motherboards. In some examples, some or all of these components are fabricated onto a single system-on-a-chip (SoC) die.

Additionally, in various examples, the electrical device 3000 may not include one or more of the components illustrated in FIG. 30, but the electrical device 3000 may include interface circuitry for coupling to the one or more components. For example, the electrical device 3000 may not include a display device 3006, but may include display device interface circuitry (e.g., a connector and driver circuitry) to which a display device 3006 may be coupled. In another set of examples, the electrical device 3000 may not include an audio input device 3024 or an audio output device 3008, but may include audio input or output device interface circuitry (e.g., connectors and supporting circuitry) to which an audio input device 3024 or audio output device 3008 may be coupled.

The electrical device 3000 may include a processing device 3002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 3002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 3000 may include a memory 3004, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 3004 may include memory that shares a die with the processing device 3002. This memory may be used as cache memory and may include embedded dynamic random access memory (eDRAM) or spin transfer torque magnetic random access memory (STT-MRAM).

In some examples, the electrical device 3000 may include a communication chip 3012 (e.g., one or more communication chips). For example, the communication chip 3012 may be configured for managing wireless communications for the transfer of data to and from the electrical device 3000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 3012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 3012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 3012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 3012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 3012 may operate in accordance with other wireless protocols in other examples. The electrical device 3000 may include an antenna 3022 to facilitate wireless communications and/or to receive other wireless communications (such as AM or FM radio transmissions).

In some examples, the communication chip 3012 may manage wired communications, such as electrical, optical, or any other suitable communication protocols (e.g., the Ethernet). As noted above, the communication chip 3012 may include multiple communication chips. For instance, a first communication chip 3012 may be dedicated to shorter-range wireless communications such as Wi-Fi or Bluetooth, and a second communication chip 3012 may be dedicated to longer-range wireless communications such as global positioning system (GPS), EDGE, GPRS, CDMA, WiMAX, LTE, EV-DO, or others. In some examples, a first communication chip 3012 may be dedicated to wireless communications, and a second communication chip 3012 may be dedicated to wired communications.

The electrical device 3000 may include battery/power circuitry 3014. The battery/power circuitry 3014 may include one or more energy storage devices (e.g., batteries or capacitors) and/or circuitry for coupling components of the electrical device 3000 to an energy source separate from the electrical device 3000 (e.g., AC line power).

The electrical device 3000 may include a display device 3006 (or corresponding interface circuitry, as discussed above). The display device 3006 may include any visual indicators, such as a heads-up display, a computer monitor, a projector, a touchscreen display, a liquid crystal display (LCD), a light-emitting diode display, or a flat panel display.

The electrical device 3000 may include an audio output device 3008 (or corresponding interface circuitry, as discussed above). The audio output device 3008 may include any device that generates an audible indicator, such as speakers, headsets, or earbuds.

The electrical device 3000 may include an audio input device 3024 (or corresponding interface circuitry, as discussed above). The audio input device 3024 may include any device that generates a signal representative of a sound, such as microphones, microphone arrays, or digital instruments (e.g., instruments having a musical instrument digital interface (MIDI) output).

The electrical device 3000 may include a GPS device 3018 (or corresponding interface circuitry, as discussed above). The GPS device 3018 may be in communication with a satellite-based system and may receive a location of the electrical device 3000, as known in the art.

The electrical device 3000 may include any other output device 3010 (or corresponding interface circuitry, as discussed above). Examples of the other output device 3010 may include an audio codec, a video codec, a printer, a wired or wireless transmitter for providing information to other devices, or an additional storage device.

The electrical device 3000 may include any other input device 3020 (or corresponding interface circuitry, as discussed above). Examples of the other input device 3020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 3000 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 3000 may be any other electronic device that processes data.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real world imperfections.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example systems, methods, apparatus, and articles of manufacture have been disclosed that enable heterogeneous die integration, miniaturization of form factor and high performance with improved yield, which are becoming increasingly important for 2D and 3D integration. Examples disclosed herein achieve these objectives by reducing the amount of variation in the alignment (or misalignment) of vias to corresponding pads of an embedded host die. As a result, the critical dimension (e.g., bottom diameter) of the vias can be larger to improve the connection reliability of such vias and/or the pads can be smaller (for higher density interconnects) while maintaining the size of the vias to maintain the connection reliability of such vias. The disclosed systems, methods, apparatus, and articles of manufacture are accordingly directed to one or more improvement(s) in the operation of a machine such as a computer or other electronic and/or mechanical device.

Example 1 includes an apparatus comprising a first die having a first side and a second side opposite the first side, the first side including a first contact to be electrically coupled with a second die, the second side including a second contact, and a substrate including a metal layer and a dielectric material on the metal layer, the first die encapsulated within the dielectric material, the second contact of the host die bonded to the metal layer independent of an adhesive.

Example 2 includes the apparatus of example 1, wherein the first die is a bridge die.

Example 3 includes the apparatus of example 1, wherein the first die is a through silicon via (TSV) die.

Example 4 includes the apparatus of any one of examples 1-3, wherein the second contact is bonded to the metal layer by a metal fusion bond.

Example 5 includes the apparatus of example 4, wherein the second contact and the metal layer include a first metal, and the fusion bond includes a region having an intermetallic phase, the region having the intermetallic phase including the first metal and a second metal different than the first metal.

Example 6 includes the apparatus of example 5, wherein the first metal is copper, and the second metal is tin.

Example 7 includes the apparatus of example 4, wherein the metal fusion bond is a direct metal-to-metal fusion bond of a single metal.

Example 8 includes the apparatus of example 4, wherein the metal fusion bond is a eutectic fusion bond that includes two metals.

Example 9 includes the apparatus of any one of examples 4-8, wherein the metal fusion bond includes metal that extends continuously across a full distance between the second side of the first die and a distal side of the metal layer.

Example 10 includes an apparatus comprising a semiconductor die, a substrate to support the semiconductor die, and a host die embedded in the substrate, the host die having a first side and a second side opposite the first side, the first side including a first contact electrically coupled to the semiconductor die, the second side including a second contact bonded to a metal layer within the substrate such that metal extends continuously across a distance between the second side of the host die and a distal side of the metal layer.

Example 11 includes the apparatus of example 10, where there is no adhesive at an interface between the host die and the substrate.

Example 12 includes the apparatus of any one of examples 10 or 11, wherein the second contact is bonded to the metal layer by a direct metal-to-metal fusion bond.

Example 13 includes the apparatus of example 12, wherein the second contact and the metal layer include copper such that the copper extends continuously across the full distance between the second side of the host die and the distal side of the metal layer.

Example 14 includes the apparatus of any one of examples 10 or 11, wherein the second contact is bonded to the metal layer by a eutectic fusion bond.

Example 15 includes the apparatus of example 14, wherein the second contact and the metal layer include copper, a region at a joint of the second contact and the metal layer including both copper and tin.

Example 16 includes the apparatus of any one of examples 10-15, wherein the host die is a bridge die.

Example 17 includes the apparatus of any one of examples 10-15, wherein the host die is a through silicon via (TSV) die.

Example 18 includes the apparatus of any one of claims 10-17, further including a via in contact with the first contact, the via to electrically couple the first contact and the semiconductor die, the via having a bottom diameter proximate and a top diameter, the bottom diameter substantially the same size as the top diameter.

Example 19 includes a method of manufacturing a substrate with an embedded host die, the method including providing the host die, the host die having a first side and a second side opposite the first side, the first side including a first contact, the second side including a second contact, bonding the second contact to a metal layer of the substrate without an adhesive at a point of the bonding, encapsulating the host die on the metal layer with a dielectric material, and providing vias through the dielectric material, the vias to electrically couple the first contact on the host die to a separate semiconductor die.

Example 20 includes the method of example 19, further including, prior to bonding the second contact to the metal layer transferring the host die to a carrier, and aligning the host die with the substrate based on fiducial marks on the carrier.

Example 21 includes the method of any one of examples 19 or 20, wherein the bonding of the second contact to the metal layer includes applying pressure and heat to promote direct metal-to-metal fusion bonding between the second contact and the metal layer.

Example 22 includes the method of any one of examples 19-21, wherein the fabricating of the host die includes depositing tin on the second contact, and the bonding of the second contact to the metal layer includes applying pressure and heat to promote eutectic fusion bonding between the second contact and the metal layer.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. An apparatus comprising:

a first die having a first side and a second side opposite the first side, the first side including a first contact to be electrically coupled with a second die, the second side including multiple second contacts, the second contacts spaced apart from one another; and a substrate including a metal layer and a dielectric material on the metal layer, the metal layer including a die pad that spans across an area at least as large as the second side of the first die, the first die encapsulated within the dielectric material, different ones of the multiple second contacts bonded, independent of an adhesive, to the die pad.

2. The apparatus of claim 1, wherein the first die is a bridge die.

3. The apparatus of claim 1, wherein the second contacts are bonded to the die pad by a metal fusion bond.

4. The apparatus of claim 3, wherein the second contacts and the die pad include a first metal, and the fusion bond includes a region having an intermetallic phase, the region having the intermetallic phase including the first metal and a second metal different than the first metal.

5. The apparatus of claim 4, wherein the first metal is copper, and the second metal is tin.

6. The apparatus of claim 3, wherein the metal fusion bond is a direct metal-to-metal fusion bond of a single metal.

7. The apparatus of claim 3, wherein the metal fusion bond is a eutectic fusion bond that includes two metals.

8. The apparatus of claim 3, wherein the metal fusion bond includes metal that extends continuously across a full distance between the second side of the first die and a distal side of the metal layer.

9. The apparatus of claim 1, wherein the second contacts are distributed across a first area, and the die pad extends across a second area, the second area greater than the first area.

10. The apparatus of claim 1, wherein the second contacts are electrically isolated from circuitry within the first die.

11. An apparatus comprising:

a semiconductor die;

a substrate to support the semiconductor die;

a host die embedded in the substrate, the host die having a first side and a second side opposite the first side, the first side including a first metal contact electrically coupled to the semiconductor die, the second side including a second metal contact bonded, without an adhesive, to a metal layer within the substrate such that metal extends continuously across a distance between the second side of the host die and a distal side of the metal layer, the substrate including a layer of dielectric material between the host die and the semiconductor die, the layer of dielectric material in contact with the first side of the host die; and a pillar via extending through the layer of dielectric material to the first metal contact, a first end of the pillar via in direct contact with the first metal contact, the pillar via to electrically couple the first metal contact and the semiconductor die, the pillar via having a bottom diameter at the first end and a top diameter at a second end opposite the first end, the bottom diameter substantially a same size as the top diameter.

12. The apparatus of claim 11, wherein the second metal contact is bonded to the metal layer by a direct metal-to-metal fusion bond.

13. The apparatus of claim 12, wherein the second metal contact and the metal layer include copper such that the copper extends continuously across a full distance between the second side of the host die and the distal side of the metal layer.

14. The apparatus of claim 11, wherein the second metal contact is bonded to the metal layer by a eutectic fusion bond.

15. The apparatus of claim 14, wherein the second metal contact and the metal layer include copper, a region at a joint of the second metal contact and the metal layer including both copper and tin.

16. The apparatus of claim 11, wherein the host die is a bridge die.

17. The apparatus of claim 11, wherein the host die is a through silicon via (TSV) die.

18. The apparatus of claim 11, wherein the second metal contact is bonded to a pad of the metal layer, the pad not used to conduct an electrical current.

19. The apparatus of claim 11, wherein the second metal contact is bonded to a pad of the metal layer, the pad having a first width, and the host die having a second width, the first width greater than the second width.

20. The apparatus of claim 11, wherein the first metal contact has a first width, and the second metal contact has a second width, the second width larger than the first width.

21. The apparatus of claim 11, wherein the second metal contact extends continuously across a majority of the second side of the host die.

22. The apparatus of claim 11, wherein the second side of the host die includes a third metal contact different from the second metal contact, the second and third metal contacts spaced apart between opposing first and second lateral edges of the host die, the second metal contact closer to the first lateral edge than the second metal contact is to a midpoint between the first and second lateral edges, the third metal contact closer to the second lateral edge than the third metal contact is to the midpoint, both the second and third metal contacts bonded to a unitary portion of metal of the metal layer.

* * * * *